(12) United States Patent
Pollet et al.

(10) Patent No.: US 10,043,890 B2
(45) Date of Patent: Aug. 7, 2018

(54) METHOD OF FORMING SPACERS FOR A GATE OF A TRANSISTOR

(71) Applicant: Commissariat A L'Energie Atomique et aux Energies Alternatives, Paris (FR)

(72) Inventors: Olivier Pollet, Grenoble (FR); Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/267,624

(22) Filed: Sep. 16, 2016

(65) Prior Publication Data

US 2017/0084720 A1   Mar. 23, 2017

(30) Foreign Application Priority Data

Sep. 18, 2015 (FR) ................................... 15 58845

(51) Int. Cl.
*H01L 29/66* (2006.01)
*H01L 21/02* (2006.01)
(Continued)

(52) U.S. Cl.
CPC .... *H01L 29/66553* (2013.01); *H01L 21/0206* (2013.01); *H01L 21/26506* (2013.01);
(Continued)

(58) Field of Classification Search
None
See application file for complete search history.

(56) References Cited

U.S. PATENT DOCUMENTS 4,529,476 A   7/1985   Kawamoto et al.
4,749,440 A   6/1988   Blackwood et al.
(Continued)

FOREIGN PATENT DOCUMENTS

EP   2 876 677 A1   5/2015
FR   12/62962       6/1961

OTHER PUBLICATIONS

French Search Report dated Jun. 2, 2016 in Patent Application No. FR 1558845 (with English translation of categories of cited documents).

*Primary Examiner* — Andres Munoz
(74) *Attorney, Agent, or Firm* — Oblon, McClelland, Maier & Neustadt, L.L.P.

(57) ABSTRACT

A method is provided for forming spacers of a gate of a field effect transistor, the gate including flanks and a top and being located above a layer of a semiconductor material, the method including a step of forming a dielectric layer covering the gate; after the step of forming, at least one step of modifying the dielectric layer by putting the dielectric layer into presence of a plasma creating a bombarding of light ions; and at least one step of removing the modified dielectric layer including a dry etching performed by putting the modified dielectric layer into presence of a gaseous mixture including at least one first component with a hydrofluoric acid base that transforms the modified dielectric layer into non-volatile residue, and removing the non-volatile residue via a wet clean performed after the dry etching or a thermal annealing of sublimation performed after or during the dry etching.

29 Claims, 6 Drawing Sheets

(51) Int. Cl.
*H01L 21/265* (2006.01)
*H01L 21/3065* (2006.01)
*H01L 21/308* (2006.01)
*H01L 21/324* (2006.01)
*H01L 21/8234* (2006.01)
*H01L 21/8238* (2006.01)
*H01L 21/311* (2006.01)
*H01L 21/3115* (2006.01)

(52) U.S. Cl.
CPC ...... *H01L 21/3065* (2013.01); *H01L 21/3085* (2013.01); *H01L 21/31116* (2013.01); *H01L 21/324* (2013.01); *H01L 21/823468* (2013.01); *H01L 21/823864* (2013.01); *H01L 29/66772* (2013.01); *H01L 29/66795* (2013.01); *H01L 21/31155* (2013.01)

(56) References Cited

U.S. PATENT DOCUMENTS

| | | | |
|---|---|---|---|
| 5,786,276 A | 7/1998 | Brooks et al. | |
| 6,255,219 B1* | 7/2001 | Xiang | H01L 29/7835 257/E21.427 |
| 6,380,030 B1* | 4/2002 | Chen | H01L 21/28273 257/E21.209 |
| 6,646,752 B2* | 11/2003 | Chen | G01B 11/0616 356/630 |
| 7,288,482 B2 | 10/2007 | Panda et al. | |
| 7,977,249 B1* | 7/2011 | Liu | H01L 21/31111 216/79 |
| 9,583,339 B2* | 2/2017 | Posseme | H01L 21/0217 |
| 2003/0207585 A1 | 11/2003 | Choi et al. | |
| 2006/0057828 A1 | 3/2006 | Omura et al. | |
| 2007/0235411 A1 | 10/2007 | Brown | |
| 2010/0112801 A1 | 5/2010 | Omura et al. | |
| 2014/0076849 A1 | 3/2014 | Moriya | |
| 2014/0187046 A1* | 7/2014 | Posseme | H01L 21/0217 438/696 |
| 2014/0199851 A1 | 7/2014 | Nemani et al. | |
| 2014/0273292 A1* | 9/2014 | Posseme | H01L 21/3065 438/5 |
| 2015/0162190 A1 | 6/2015 | Posseme | |

* cited by examiner

METHOD OF FORMING SPACERS FOR A GATE OF A TRANSISTOR

TECHNICAL FIELD OF THE INVENTION

This invention generally relates to the field effect transistors (FET) used in the microelectronics industry and more particularly the production of spacers of gates of transistors of the metal-oxide-semiconductor type (MOSFET) used mostly for the production of all sorts of integrated circuits.

PRIOR ART

The never-ending race to reduce dimensions which characterizes the entire microelectronics industry was only able to take place with the contribution of key innovations all throughout decades of development since the first integrated circuits were produced industrially in the 1960's. A very important innovation that goes back to the 1970's, and which is still used, consists in producing MOSFET transistors using a technique wherein the source and drain electrodes are self-aligned on those of the gate and therefore do not require any photoengraving operation in order to define them. Combined with the use of polycrystalline silicon gates, it is the gates themselves, produced first, that are used as a mask during the doping of the source and drain zones of the transistors.

FIG. 1a is a cross-section view of an example of this type of transistor 100 in the course of production. Here there are the source and drain zones 110, globally designated as source/drain zones, since they are very generally perfectly symmetrical and can play the two roles according to the electrical polarizations that are applied to the transistor. The gate is conventionally comprised of a stack of layers 120 of which a large portion is always constituted of polycrystalline silicon 123. The formation of the source and drain zones is typically carried out by ionic implantation 105 of dopants in the zones 110, the gate 120 used as a mask as mentioned hereinabove, as such preventing the doping of the zone of the MOSFET transistor wherein, according to the voltages applied on the gate, will be able to develop the conduction channel 130 between source and drain.

The basic technique, described very briefly hereinabove, well known to those skilled in the art as well as numerous alternatives, has been constantly refined with the purpose of improving the electrical performance of the transistors while still making it possible to accommodate the successive reductions in size of the transistors required by an ever-increasing integration of a larger number of components into an integrated circuit.

A currently widely used technique consists in manufacturing the integrated circuits by using elaborated substrates 140 of the silicon on insulator (SOI) type. The elaborated SOI substrate is characterized by the presence of a fine surface layer of monocrystalline silicon 146 resting on a continuous layer of silicon oxide 144, referred to as buried oxide layer (BOX). The solidity and the mechanical rigidity of the whole are provided by the layer 142 which forms the body of the SOI substrate, often qualified as "bulk" in order to indicate that the starting substrate is very generally made of solid silicon. This structure offers many advantages for the production of MOSFET transistors. In particular, it allows for a drastic reduction in the parasitic capacities due to the presence of the continuous isolating layer 144. With regards to the invention, it will be retained only that the surface layer of monocrystalline silicon 146 can be controlled precisely in thickness and in doping. In particular, it is advantageous for the performance of the transistors that the channel 130 be fully depleted of carriers. This is obtained by carrying out the transistors using SOI substrates of which the surface layer 146 is very thin which is not without a disadvantage moreover as shall be seen in the description of the invention. This type of transistor is as such designated by the acronym FDSOI.

An improvement in the basic technique of self-aligning that was universally adopted consists in the forming of spacers 150 on the flanks of the gate. The spacers 150, typically made of silicon nitride (SiN), will allow in particular for the implementation of a technique referred to as "raised Source and Drain". In order to be able to maintain low electrical access resistances to the source and drain electrodes, despite the reduction in size of transistors, it was indeed necessary to increase their section. This is obtained by selective epitaxy of the source/drain zones 110. During this operation the initial layer of monocrystalline silicon 146 is increased 112 locally. The zones of gates must therefore be protected in order to prevent the growth from also taking place from the polycrystalline silicon 123 of the gate. This is, among other things, the role of the spacers to provide this function. They also provide the role or preserving the gate during the silicidation of the contacts (not shown) which is then carried out for the same purpose in order to reduce the series access resistance to the electrodes of the transistor.

The forming of spacers 150 has become a crucial step in the formation of transistors which now reach dimensions that are commonly measured in nanometers (nm=$10^{-9}$ meters) and which globally are of decananometric sizes. The carrying out of the spacers is done without the intervention of any photoengraving operation. They are self-aligned on the gate 120 from the deposit of a uniform layer of silicon nitride 152 (SiN) which is then subjected to a very highly anisotropic etching. This etching of the SiN preferentially attacks the horizontal surfaces, i.e. all of the surfaces that are parallel to the plane of the SOI substrate. It leaves in place, imperfectly, only the vertical portions of the layer 152, those that are substantially perpendicular to the plane of the substrate, in order to obtain in practice the patterns 150 of which the ideal shape would obviously be rectangular.

With the known solutions, the reduction in size of the transistors makes it very delicate to obtain spacers that fully play their role of insulating and not inducing any defects in the production of transistors using SOI substrates. Indeed, in the framework of this invention, and as shall be detailed in what follows, it was observed that several types of defects such as those mentioned hereinbelow appear during the etching of the spacers by using one or the other of the known methods of anisotropic etching.

FIGS. 1b, 1c and 1d each show a type of defect observed.

A type of etching which referred to as "dry" is used in particular and which is implemented using a method which is most often designated by its acronym RIE (reactive-ion etching). This is a method of etching wherein, in a confined enclosure, a plasma is formed that reacts physically and chemically with the surface of the trench to be etched. In the case of the etching of a silicon nitride layer, which is as has been seen the preferred material for carrying out spacers, the reactive gas is typically methyl fluoride (CH3F) that is made to react with the material to be etched by also introducing dioxygen (O2). An etching plasma is as such formed based on the chemistry of the fluorine and often designated by its constituents: CH3F/O2/He. In this plasma the fluorine compound is used to etch the silicon nitride while oxygen makes it possible to limit the polymerization of the methyl fluoride and is also used to oxidize the silicon when this material is reached during etching. The oxide layer formed on the silicon makes it possible to slow down the etching of the silicon at the price however of a transformation on the surface of the latter into oxide and therefore a surface consumption of silicon. The helium serves as a diluent for the oxygen.

The advantage of this type of etching is that it is sufficiently anisotropic and makes it possible to sufficiently control the profile of the spacers 150 even if in practice the ideal rectangular shape cannot be obtained. The disadvantage of this type of etching is that the attack selectivity of the underlying silicon is however limited. The selectivity, i.e. the ratio of the etching speeds between the silicon nitride and the silicon is about 10 and can reach a maximum of 15 according to the formation conditions of the plasma (nitride is etched 10 to 15 times faster than silicon).

Etching referred to as "wet" with a hydrofluoric acid (HF) or phosphoric acid (H3PO4) base are also used which have much better selectivity, respectively, with regards to silicon or its oxide (SiO2) but which do not however make it possible to control the profile of the spacers since the etching is primarily isotropic in this case. Note here that this type of etching is also qualified as "wet clean".

Note here that there are many publications on the subject of etching silicon nitride and/or gate spacers in general. Reference can be made for example to the following US patents or patent applications: 2003/0207585; U.S. Pat. Nos. 4,529,476; 5,786,276 and 7,288,482.

FIG. 1b shows a first problem that is in relation with the insufficient attack selectivity that exists during a dry etching of the CH3F/O2/He type between the silicon nitride and the silicon of the surface layer 146. The result is that a significant fraction of the thin surface layer of monocrystalline silicon 146 of the SOI substrate can then be partially consumed 147 during the anisotropic etching of the nitride. As mentioned hereinabove, the surface layer 146 is chosen to be of low thickness in order to improve the electrical characteristics of the transistors. It is typically less than 10 nm. The remaining thickness 145 can be very low. In these conditions the ionic implantation 105 for forming the source and drain zones 110 that will follow is able to highly damage the remaining monocrystalline silicon. The energy for the implantation of the dopants can be sufficient to provoke a complete amorphization 149 of the monocrystalline silicon which will then in particular compromise the following step of epitaxial growth 112 intended to form the raised source/drain. As mentioned hereinabove, this latter operation is made necessary due to the decrease in the size of the transistors in order to be able to maintain the access resistances to the source and drain electrodes at values that are sufficiently low as to not affect the electrical operation of the transistors. Growth from the layer of silicon that is partially or entirely made amorphous will create many defects in the layer formed by epitaxy.

FIG. 1c shows another problem where there is not significant consumption of the silicon of the surface layer 146 but there is a formation of "feet" 154 at the bottom of the remaining silicon nitride patterns on the flanks of the gate after etching. The consequence is that the transition 114 of the junctions which are formed after doping by ionic implantation 105 of the source and drain zones 110, with the zone of the channel 130, is much more abrupt than when the spacers do not have feet as shown in the preceding figures. The presence of feet 154 affects the electrical characteristics of the transistors. Note here that the formation or not of feet at the bottom of the spacers and the consumption or not of silicon from the surface layer of silicon 146 of the SOI substrate, described in the preceding figure, are antagonistic adjusting parameters of the etching which require that a compromise be able to be found for which, ideally, feet are not formed and the surface layer of silicon is not significantly attacked.

FIG. 1d shows a third problem which is produced when the etching produces excessive erosion of the spacers in the top portions of the gates and exposes the polycrystalline silicon 123 in these zones 156. The consequence is that the later epitaxial growth 112 in order to form the raised source/drain will also be produced at these locations, as well as a silicidation of contacts parasites, which risks causing short circuits between electrodes. Indeed, the etching of the spacers requires that the etching time be adjusted in order to etch, for example, 150% of the thickness of the nitride deposited. That is to say that an overetching of 50% is made in this example so as to account for the non-uniformity of the deposit, or of the etching operation itself, on a trench. As such, in certain portions of the trench it can be observed that there is an excessive overetching that exposes the gate zones 156. This type of defect is also qualified as "faceting".

In addition, for some applications it may be required to provide a protective layer often with a carbon base such as a mask or a photosensitive or heat-sensitive resin in order to protect during the etching of the spacers structures formed on the substrate. Such is for example the case during the production of PMOS transistors close to NMOS transistors of which the spacers are in the process of production. The known methods of etching can lead to a high consumption of this layer of protection during the etching of the spacers of the PMOS transistor.

Other solutions have been proposed in documents US2014/0273292 and, FR12/62962. These solutions call for a step of implanting a silicon nitride layer in order to modify it on either side of the gate, followed by a step of removing the modified silicon nitride layer.

In the solution FR12/62962 the step of removing the modified nitride layer can be carried out by a wet clean with a hydrofluoric acid (HF) base. The disadvantage is that the wet clean with a HF base does not allow for a selective removal of the modified nitride layer with respect to the unmodified nitride layer. The selectivity at the unmodified nitride layer is, for example, 7 (for an HF concentration of 1%).

Moreover hydrofluoric acid is a chemical compound of which one of the main properties is to etch silicon oxide, therefore this method is intrinsically non-selective to the silicon oxide layer forming the hard mask as well as the shallow trench isolation (STI). The selectivity of this layer of oxide with HF is, for example, 1 (for an HF concentration of 1%).

This invention has for object to propose a method for forming spacers that fully play their role of isolation and that would suppress or limit at least some of the defects in the production of transistors, such as the consumption or the alteration of the semiconductor material (i.e. Si, SiGe) of the active layer underlying to the layer to be etched, the formation of "feet" at the bottom of the patterns on the flanks of the gate of a transistor, the consumption of a protective layer with a carbon base, etc.

The invention makes it possible to obtain spacers with a dielectric material base while still reducing and even eliminating the problems of the solutions known and mentioned hereinabove.

The other objects, characteristics and advantages of this invention shall appear during the examination of the following description and of the accompanying drawings. It is understood that other advantages can be incorporated.

SUMMARY OF THE INVENTION

In order to achieve this objective, an aspect of this invention relates to a method for forming spacers of a gate of a field effect transistor, with the gate comprising flanks and a top and being located above a layer made of a semiconductor material, with the method comprising a step of forming a dielectric layer covering the gate of the transistor, with the method comprising, after the step of forming the dielectric layer, at least one step of modification of said dielectric layer by putting into presence of the dielectric layer with a plasma creating a bombarding of anisotropic light ions according to a favored direction parallel to the flanks of the gate, with the conditions of the plasma, in particular the energy of the light ions and the dose implanted being chosen in such a way as to modify, by implantation of the light ions, at least portions of the dielectric layer which are located at the top of the gate and on either side of the gate and which are perpendicular to the flanks of the gate by retaining portions of the dielectric layer covering the modified or unmodified flanks of the gate over their entire thickness; with the light ions being ions with a hydrogen base and/or with a helium (He) base. The method also comprises at least one step of removing the modified dielectric layer using selective etching of said modified dielectric layer with respect to the layer made of a semiconductor material and with respect to the unmodified dielectric layer.

Advantageously, the step of removing the modified dielectric layer comprises a dry etching carried out by the putting into presence of a gaseous mixture, more preferably only gaseous, comprising at least one first component with a hydrofluoric acid (HF) base, with the hydrofluoric acid transforming into non-volatile residue, more preferably non-volatile at ambient temperature, the modified dielectric layer.

Advantageously, the step of removing the modified dielectric layer comprises, only after the dry etching, a removal of the non-volatile residue at ambient temperature by a wet clean or a thermal annealing of sublimation.

Particularly advantageously, this invention allows for a highly anisotropic and selective etching of the modified dielectric layer with respect to a layer with a silicon oxide base. The range of variation of the parameters of the gaseous HF method making it possible to obtain a selectivity of the modified dielectric layer, for example with a silicon nitride (SiN) base with respect to the unmodified dielectric layer, is more extensive.

An advantage of this invention is that the putting into presence can be carried out in a simple chemical reactor: a hermetic enclosure into which the reagents are introduced and which operates either at ambient temperature and atmospheric pressure, or at a temperature higher than ambient temperature and at a pressure less than atmospheric pressure. The putting into presence is therefore not advantageously carried out in a plasma reactor of which the equipment is more complex than a chemical reactor. As such, the gaseous HF is simple to implement compared to a plasma. Indeed, a simple chemical reactor, possibly regulated in pressure and temperature, is sufficient. In the case of a plasma, it would be necessary to have RF generators and work with a much lower pressure, therefore the equipment in this case would be clearly more complex.

Advantageously, the thermal annealing and the HF etching are carried out during successive and not simultaneous steps. This makes it possible to prevent the temperature required for the annealing from harming the adsorption of the HF on the surface of the wafer, which would be detrimental to the unfolding of the reaction between the gaseous HF and the modified dielectric layer, for example with a SiN base.

Particularly advantageously, this invention not only allows for a control of the damage that could be generated following an ionic implantation, but also an improvement in the removal of the modified dielectric layer, by proposing a method that has better etching selectivity between the modified dielectric layer and the unmodified dielectric layer on the one hand, between the modified dielectric layer and the layer of silicon oxide and between the modified dielectric layer and the layer of semiconductor material, on the other hand. Advantageously, the selectivity of the method of gaseous HF between the modified dielectric layer and the layer of semiconductor material is infinite (in other words, the gaseous HF does not etch the semiconductor material).

Advantageously, this invention proposes an infinite selectivity of the modified dielectric layer. As such, this invention allows for better control of the critical dimensions. The method according to this invention further allows for a selective etching of the modified dielectric layer with respect to the other unmodified layers for example, preventing any risk of consuming all or a portion of a layer with a silicon nitride base or a layer with a silicon oxide base.

In this invention, the method is carried out sequentially. The etching, advantageously "dry", of the modified dielectric layer, for example made of silicon nitride (SiN), is carried out using pure gaseous hydrofluoric acid (no co-injection of alcohol). At the end of the dry etching, non-volatile residue at ambient temperature (for example, in the form of salts) are present on the modified dielectric layer.

"Salt" refers to an ionic solid compound formed of an anion and a cation but of which the global electrical charge is neutral.

According to a first embodiment, the non-volatile etching residue can then be removed by carrying out a simple wet clean with water. According to another preferred but non-limiting embodiment of the invention, in order to remove the non-volatile residue on the surface of the modified dielectric layer, an annealing is carried out after the "dry" etching of the modified dielectric layer. This annealing makes it possible to sublimate the non volatile residue at ambient temperature, typically solid salts. This method can be used, for example, as a replacement for a "wet" clean, for example with a water base. Advantageously, this alternative method (pure gaseous HF followed by annealing) proposes an entirely "dry" method (which does not contain any steps in liquid phase), which can be interesting to eliminate the known problems caused during "wet" etchings carried out for the formation of patterns, for example.

According to an advantageous embodiment, a step of pre-annealing is carried out before the dry etching with a gaseous hydrofluoric acid base. This makes it possible to remove the humidity that is naturally absorbed on substrates and as such prevents introducing water, which is a proton acceptor, inside the treatment chamber of the etcher; said chamber comprising hydrofluoric acid (HF). As such the step of pre-annealing makes it possible to further increase the selectivity between a modified silicon nitride layer (SiN) and a layer of silicon oxide (SiO2).

Particularly advantageously, no etching of a layer of silicon oxide (SiO2) can occur since the method of etching a layer with a silicon oxide base functions only with the simultaneous presence of the hydrofluoric acid and proton acceptor groups (such as alcohol, water). It is therefore through the absence of the simultaneous putting into presence of the hydrofluoric acid and of proton acceptor groups, that is obtained, surprisingly, a large selectivity between a modified silicon nitride layer (SiN) and a silicon oxide layer (SiO2), while still allowing for a highly anisotropy etching. The silicon oxide layer (SiO2) for example forms a hard mask or shallow trench isolation.

According to an embodiment, the dry etching is carried out by putting into presence of a gaseous mixture free of proton acceptor groups, such as for example alcohol or water, for example in the form of vapor. As such, the gaseous mixture injected does not contain any —OH groups. According to an embodiment, this gaseous mixture comprises only hydrofluoric acid (HF).

Unexpectedly, this sequential process also shows a large selectivity between an unmodified silicon nitride layer (SiN) and a modified silicon nitride layer.

Particularly advantageously, the sequential method according to this invention offers better etching selectivity between the silicon (Si) and the silicon-germanium (SiGe), in particular thanks to the infinite intrinsic selectivity of the hydrofluoric acid for these materials. This method also has a better etching selectivity between the silicon oxide (SiO2) forming for example the hard mask and the unmodified silicon nitride (SiN), in particular thanks to the absence of proton acceptor groups by using a method with a pure gaseous hydrofluoric acid base. Other known solutions for removing a modified silicon nitride layer SiN such as hydrofluoric acid (HF) in liquid phase or phosphoric acid (H3PO4) do not allow for such a selectivity for, respectively, silicon oxide (SiO2) or unmodified silicon nitride (SiN).

Advantageously, the parameters of the step of removing the modified dielectric layer, in particular the gas ratio between the first component and the second component used during the dry etching, are provided in such a way that the modified dielectric layer can be etched selectively with respect to the layer made of a semiconductor material and with respect to the unmodified dielectric layer and, advantageously, with respect to the silicon oxide layer. It is therefore important to find the correct ratio between the content for the first component and for the second component during the dry etching intended to remove the modified dielectric layer. Advantageously, the gas ratio between the first component (for example, gaseous HF) and the second component (for example, pure N2) is between 1:25 and 1:1.

A lower ratio, which would be the case if the flow rate of the first component were reduced, would have the consequence of limiting the effectiveness of the etching of the modified dielectric layer. A higher ratio, which would be the case if the flow rate of the first component were increased, would have the consequence of limiting the selectivity with respect to the unmodified silicon nitride layer and with respect to the silicon oxide layer. In this patent application, ratio between two gaseous components refers to a ratio concerning the respective flow rates of the introduction of the components into the enclosure of the chemical reactor (during the use of gaseous HF). Each flow rate is usually measured in standard cubic centimeters per minute (sccm). Typically a flow rate is measured with a flowmeter associated with each flow of gas entering the reactor.

Advantageously, the dry etching consumes the modified dielectric layer preferentially at the semiconductor material layer and at the unmodified dielectric layer. As such, the risk of excessive consumption of the surface layer of the semiconductor material is reduced, and even suppressed.

According to a preferred embodiment, the etching of the dielectric layer is carried out using chemistry without carbon. This advantageously makes it possible to prevent the deposit of a carbon layer that can hinder the etching of the dielectric layer.

Optionally, the method can furthermore have at least any one of the characteristics and steps hereinbelow.

According to an embodiment, the dry etching is carried out by the putting in presence of a gaseous mixture comprising only hydrofluoric acid (HF) and possibly an inert gas.

According to an embodiment, the dry etching is carried out by the putting into presence of a gaseous mixture comprising only a first component with a hydrofluoric acid base.

According to an embodiment, the dry etching is carried out by the putting into presence of a gaseous mixture free from proton acceptor groups.

Preferably, the gaseous HF is available in a bottle and can therefore be injected directly into the reactor after expansion of the pressure at which the reactor operates. The gaseous HF can also be generated by evaporation of liquid HF and driving by a flow of nitrogen (N2) to the reactor.

The gaseous HF, regardless of the method used hereinabove, is more preferably mixed with a flow of pure nitrogen in order to control the HF concentration in the reactor. This mixture between gaseous HF and pure N2 is carried out either in-situ in the reactor, or upstream of the reactor in a mixing chamber.

the step of removing the modified dielectric layer comprising a removal of the non-volatile residue by a wet clean or a thermal annealing of sublimation is carried out exclusively after the step of dry etching. The wet clean or the thermal annealing of sublimation are not carried out during the step of dry etching.

The parameters of the step of removing the modified dielectric layer, in particular the gas ratio between the first component and the second component used during the dry etching, are provided in such a way that the modified dielectric layer can be selectively etched with respect to the layer made from a semiconductor material and with respect to the unmodified dielectric layer.

The first component is generated by evaporation using a liquid source or using a pressurized bottle.

The putting into presence is carried out in a chemical reactor.

The reactor comprises an enclosure. The putting into presence is carried out at ambient temperature and atmospheric pressure or is carried out at a temperature greater than the ambient temperature and at a pressure less than atmospheric pressure.

The first component is comprised solely of HF.

The gaseous mixture comprises a second component with an inert gas base, chosen from nitrogen (N2) and/or argon (Ar).

The gas ratio between the first component and the second component is between 1:25 and 1:1.

The dry etching is carried out under a temperature between 15° C. and 80° C., a pressure between 40 Torr to 760 Torr, during a duration ranging from a few seconds to a few minutes.

The removal of non-volatile residue is carried out after the dry etching.

The removal of non-volatile residue comprises an annealing carried out at a temperature between 200° C. and 400° C.

The annealing is carried out under a low pressure between $10.10^{-3}$ Torr and 2 Torr.

The annealing is carried out for a time between 60 and 600 seconds.

The removal of non-volatile residue comprises a wet clean with a deionized water base.

Prior to the step of removing the modified dielectric layer, a vacuum thermal annealing, at a temperature greater than 100° C.

The dielectric layer is formed from one or several dielectric materials of which the dielectric constant k is less than or equal to 7.

The dielectric layer is a nitride layer.

The dielectric layer is a layer with a silicon (Si) base.

The material of the dielectric layer is taken from: SiCO, SiC, SiCN, SiON, SiOCN, SiCBN, SiOCH, and SiOx, for example SiO2.

The semiconductor material is silicon and the step of removing the modified dielectric layer is carried out partially at least by dry etching selectively with silicon (Si) and/or with silicon oxide (SiO2).

A single step of modification is carried out in such a way as to modify the dielectric layer over its entire thickness over all of the surfaces parallel to the plane of a substrate whereon the gate rests and to not modify the dielectric layer over its entire thickness over the surfaces perpendicular to this plane.

The layer of semiconductor material is taken from: silicon (Si), germanium (Ge), silicon-germanium (SiGe) and wherein the light ions are taken from helium (He) and/or hydrogen (H2) and/or ammonia (NH3).

The light ions are of a hydrogen base and the flow rate of the light ions with a hydrogen (H) base is between 10 and 500 sccm (standard cubic centimeters per minute), with the ions with a hydrogen (H) base being taken from: H, H+, H2+, H3+.

The light ions are with a helium base and the flow rate of the light ions with a helium (He) base is between 50 and 500 sccm.

The step of modification of the dielectric layer is carried out with a polarization power or source power between 20V (volt) and 500V, with a pressure between mTorr (milliTorr) and 100 mTorr, at a temperature between 10° C. and 100° C., for a duration from a few seconds to a few hundred seconds.

The step of modification of the dielectric layer carried out using a plasma modifies the dielectric layer continuously from the surface of the dielectric layer and over a thickness between 1 nm (nanometer) and 30 nm, preferably between 1 nm and 10 nm.

The transistor is a transistor of the FDSOI type or of the FinFET type.

BRIEF DESCRIPTION OF THE FIGURES

The purposes and objects as well as the characteristics and advantages of the invention shall be clearer in the detailed description of an embodiment of the latter which is shown in the following accompanying drawings wherein.

The drawings joints are provided by way of examples and do not limit the invention. These drawings are diagrammatical representations and are not necessarily to the scale of the practical application. In particular, the relative thicknesses of the layers and of the substrates do not represent reality.

DETAILED DESCRIPTION OF THE INVENTION

It is specified that in the framework of this invention, the term "on", "overmounted" or "underlying" or the equivalents thereof do not necessarily mean "in contact with". As such for example, the depositing of a first layer on a second layer, does not necessarily means that they two layers are directly in contact with one another but this means that the first layer at least partially covers the second layer by being either directly in contact with it or by being separated from it by another layer or another element.

In the following description, the thicknesses are generally measured according to directions perpendicular to the plane of the inner face of the layer to be etched or of a substrate whereon the lower layer is arranged. As such, the thicknesses are generally taken according to a vertical direction in the figures shown. On the other hand the thickness of a layer covering a flank of a pattern is taken according to a direction perpendicular to this flank.

FIGS. 2a to 2d describe the steps of a detailed example of a method according to the invention applied to the carrying out of transistors of the FDSOI type. The principles of these steps can also be applied to the forming of spacers on the flanks of a gate of another type of transistor.

Figure 2A:
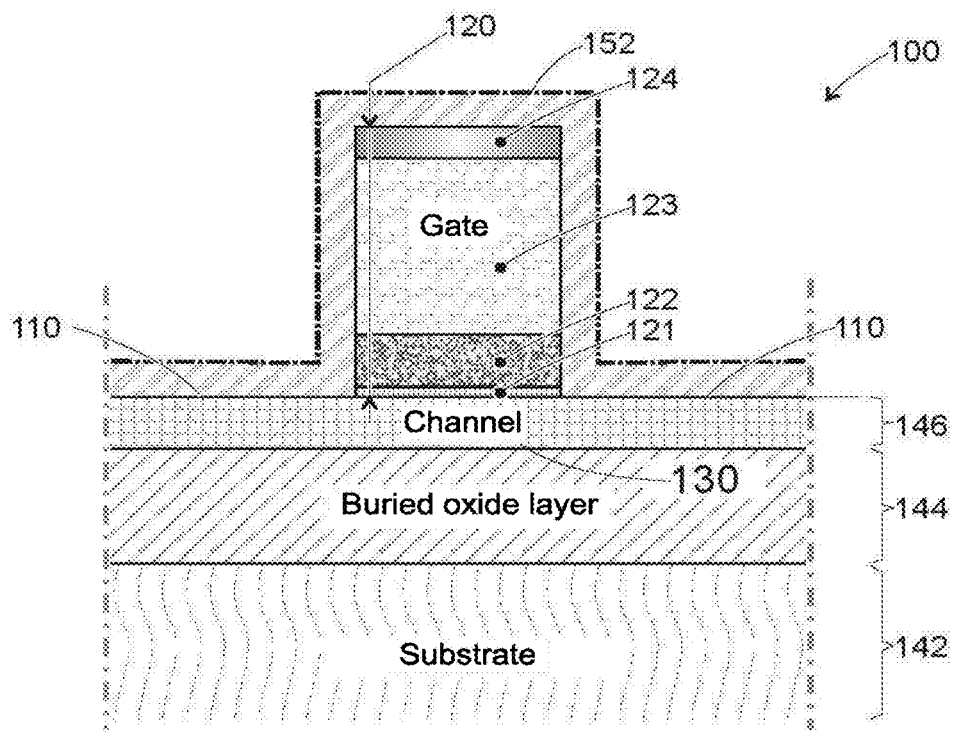
FIGS. 2a to 2d show the steps of an example of a method according to the invention applied to the carrying out of transistors of the FDSOI type.

FIG. 2a shows the step of depositing of a dielectric layer 152, of a preferably substantially uniform thickness, over all of the surfaces, vertical and horizontal, of the devices in the process of manufacture. This step, is carried out more preferably using a method of depositing referred to as LPCVD (low pressure chemical vapor deposition). This type of depositing practiced at a pressure under atmospheric allows indeed for a uniform deposit on all of the surfaces regardless of their orientation.

Although not necessary for the comprehension of the method of the invention, note that the gate electrode is in this example comprised, at this stage, of the method of several layers for some types of transistors. In addition to the layer of polycrystalline silicon 123, it can be found, in the stack of layers forming the gate 120, first of all the gate oxide thin isolation layer 121 through which an electric field will be able to develop in order to create the underlying conduction channel 130 between source and drain, when sufficient electrical voltage is applied on the gate. In the most recent MOSFET transistors, a technology is implemented qualified as "high-k/metal gate" i.e. the isolating layer 121 is made of an isolating material with high permittivity (high-k) covered by a metal gate represented by the layer 122. This technology was developed in particular to reduce the leakage current through the gate which had become much too high due to the decrease in the thickness of the isolating layer 121 to atomic dimensions. At this stage, the stack of layers of the gate also comprises a hard protective mask 124 that will be removed later in order to allow for the resuming of contact on this electrode. This hard mask, which remains in place after the etching of the gate, is typically made of silicon oxide (SiO2). Its role is to protect the top of the gate from any damage during the etching of the spacers.

Preferably, the structure also comprises shallow trench isolation (STI) passing through the layer of semiconductor material 146 forming the channel until reaching at least an underlying isolating layer such as the buried oxide layer 144. These trenches (not shown in the figures) are typically made of SiO2.

Preferably, the isolating layer 121 is arranged in contact with the layer 146 made of a semiconductor material, forming the conduction channel. Preferably, the layer 122 is arranged in contact with the layer 121. Preferably, the layer 123 is arranged directly in contact with the gate oxide formed by the layer 121, if the layer 122 is absent or is arranged directly in contact with the layer 122. Preferably, the dielectric layer 152 is arranged directly in contact with the layer 123 on the flanks of the gate. Preferably, the dielectric layer 152 is arranged directly in contact with the layer 146 made of a semiconductor material intended to form the conduction channel.

According to an embodiment, the dielectric layer 152 has a nitride base. According to an embodiment, the dielectric layer 152 of nitride has a thickness between 5 and 20 nm, and typically of about 10 nm. As an example, the dielectric layer 152 has a silicon nitride (SiN) base. The dielectric layer 152 can also be chosen from silicon oxycarbide (SiCO), silicon carbide (SiC), carbosilicon nitride (SiCN), silicon oxycarbonitride (SiOCN), SiCBN, hydrogenated silicon oxycarbide (SiOCH) and silicon oxide SiOx with x greater than or equal to 1 such as SiO2.

According to another embodiment, the dielectric layer 152 comprises a dielectric material with low permittivity c (the permittivity is noted as epsilon) or with a low dielectric constant k, with more preferably k less than or equal to 7. As such, this invention is not limited to a dielectric layer formed with a nitride base. This invention is, moreover, also not limited to a dielectric layer of silicon nitride (SiN).

This invention extends advantageously to any spacer that comprises a dielectric material with low permittivity E (referred to as "low-k"). "Permittivity of a material" means, at the microscopic level, the electrical polarizability of the molecules or atoms constituting said material. The permittivity of a material is a tensor magnitude (the response of the material can depend on the orientation of the crystallographic axes of the material), which is reduced to a scalar in isotropic mediums. The dielectric constant is noted as k in the field of integrated circuits and semiconductors, for example. So-called "low-k" materials are dielectrics with low permittivity. They are used as insulators between metal interconnections in order to reduce the coupling between the latter.

In an embodiment, the dielectric layer 152 has or comprises a material that has a dielectric constant less than 4 and more preferably less than 3.1 and more preferably less than or equal to 2, which as such makes it possible to reduce the parasitic capacity in order to possibly improve the performance of the transistor. For example, as indicated hereinabove the material of the dielectric layer 152 is taken from: SiCO, SiC, SiCN, SiOCN, SiON, SiCBN, SiOCH and SiOx with x greater than or equal to 1 such as for example SiO2.

This makes it possible to reduce the parasitic capacity and to consequently improve the performance of the transistor.

In a preferred but solely optional manner, the method of the invention comprises an optional step of reducing the dielectric constant of the dielectric layer 152. According to an advantageous embodiment, the reduction in the dielectric constant is obtained during the step of depositing of the dielectric layer 152.

According to an embodiment, the reduction in the dielectric constant comprises the introduction into the dielectric layer 152 being formed of precursors that form connections that reduce the polarizability of the dielectric layer 152. These precursors are chosen in such a way as to generate connections that are less polar than silicon nitride, such as Si—F, SiOF, ISi—O, C—C, C—H, and Si—CH3.

According to another embodiment, alternative or combinable with the preceding one, the reduction in the dielectric constant comprises the introduction into the dielectric layer 152 being formed of a porosity.

Figure 2B:
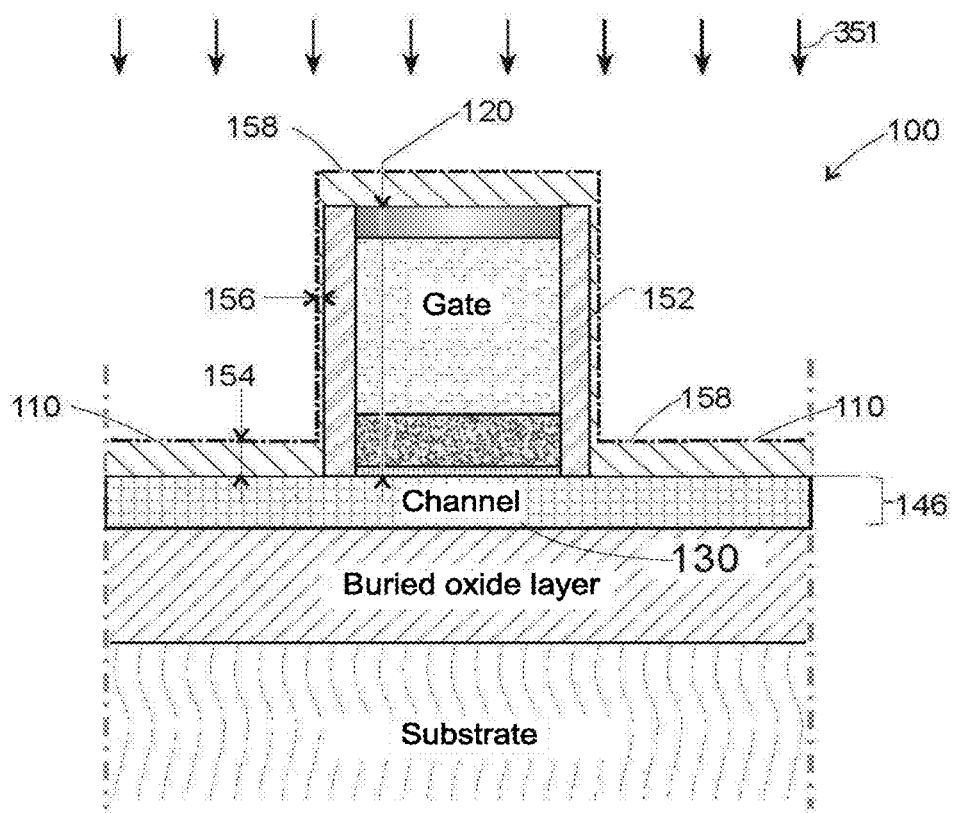

FIG. 2b shows the following step of the invention applied to the carrying out of FDSOI transistors wherein a modification 430 is directly carried out of the dielectric layer 152 that has just been deposited. Optionally, this operation may have been preceded with a "main" etching 420, for example a conventional dry etching of the CH3F/O2/He type.

The step of modification 430 of the dielectric layer 152 such as deposited, or of the layer remaining after a first conventional etching, is carried out via implantation 351 of light species also designated as light ions. In the framework of this invention, these ions are ions with a hydrogen (H) base and/or a helium (He) base.

The ions with a hydrogen (H) base are for example taken from: H, H+, H2+, H3+.

Advantageously, these species can be taken alone or in a combination. For example, the possible chemistries for the implantation are: H, He, NH3, He/H2, He/NH3. These ions can be implanted in a material to be etched, without provoking a dislocation of its atomic structure such that it would generate a pulverization of the latter.

"Light ions" are ions coming from materials of which the atomic number in the periodic table is low. Generally all of the elements that can be implanted in the material to be etched, without provoking a dislocation of its atomic structure such that it would generate a pulverization of the latter, and therefore without a re-depositing of the material etched on the walls of the reactor or the patterns in the process of etching themselves, are able to be suitable.

The invention allows for a highly anisotropic etching.

Particularly advantageously, the implantation of light species is favored by the incorporation into the plasma of a second component allowing for the dissociation of light ions and therefore the increase in the density of light ions in the plasma and the increase of the dose implanted.

Advantageously, the implantation parameters, in particular the energy communicated to the ions, the duration and the implantation dose are provided in such a way that the modified dielectric layer 158 can be selectively etched in relation to the layer 146 made from a semiconductor material.

Advantageously, these parameters are also adjusted in such a way that the modified dielectric layer 158 can be selectively etched in relation to the unmodified portion of the dielectric layer 152.

Advantageously, these parameters are also adjusted in such a way that the modified dielectric layer 158 can be selectively etched in relation to a layer made from an oxide typically an oxide of said semiconductor material, with the latter forming for example a gate oxide layer. Typically, the etching is selective of the dielectric material modified by implantation of hydrogen with respect to the silicon oxide.

The implantation is carried out, according to a non-limiting example of the invention, in a plasma with a gaseous hydrogen (H2) base. More generally, all of the gaseous components, that can by dissociation release the light ions mentioned hereinabove, can be used in the plasma. Note here that this step of modification 430 of the dielectric layer 152 to be etched can be carried out in many different ways by adapting all sorts of means commonly used by the microelectronics industry. Standard etching reactors are in particular used wherein plasmas with a low or high density can be carried out and wherein the energy of the ions can be controlled in order to allow for the implantation of the light species hereinabove intended to modify the layer to be etched. A type of plasma referred to as by immersion can also be used which is commonly used to carry out an implantation of species on the surface of a device in the process of manufacture. Finally, the implantation can also be done in a standard implanter wherein the ions are accelerated in an electric field in order to obtain their implantation in a solid.

The operation of modification is advantageously highly anisotropic for the carrying out of spacers on the flanks of the gates due to the directionality of the ions of the plasma or of the implanter. It therefore preferentially affects the horizontal surfaces, i.e. all of the surfaces parallel to the plane of the substrate 142. The thickness modified over the horizontal surfaces 154 is as such clearly more substantial than on the vertical surfaces 156 i.e. on all of the surfaces perpendicular to the plane of the elaborated substrate 146, whereon the gate is arranged. Advantageously, the implantation according to this invention makes it possible to not attack the vertical surfaces. As such, according to a preferred embodiment, the modified thickness on the vertical surfaces 156 is practically zero, more preferably of about 1 to 3 nanometers.

This plane is perpendicular to the cutting plane shown in FIGS. 2a to 2d. The elaborated substrate 142 forms more preferably a wafer with two parallel faces. It has for example the shape of a disc, a square, a polygon, etc. The thin layer 146, the buried oxide layer 144 and the sold substrate 142 are arranged according to parallel planes. As such, a surface will be qualified as horizontal if it is parallel to the plane of the layer or layers forming the substrate 146, whereon the gate is formed and a surface will be qualified as vertical is it is perpendicular to this same plane.

Typically, a thickness 154 of 10 nm on the horizontal surfaces can be modified during this operation. A thickness 156 of the layer 152 ranging from 1 to 3 nm is however also modified on the vertical surfaces regardless of the conditions of the plasma. These vertical surfaces in relation to the plane of the substrate 146 are therefore parallel to the flanks of the gate. The modified thicknesses depend on the conditions of implementation, in particular the means used (plasma or implanter) and also whether it is desired to obtain the etching of the spacers in a single global step of modification and of etching or on the contrary these operations are repeated until a full etching is obtained.

As such, according to the particular implementations of the method of the invention and of the initial thickness of the dielectric layer 152, the step of modification of this layer can affect all of this layer or, as shown in the example in FIG. 2b, only a portion of the latter. In this particular case, the material is modified over its entire thickness but only on horizontal zones 154. In this case, the step of modification 430 and the following step of removing 440 the modified layer described hereinafter can be repeated until the complete removal of the dielectric material from the modified dielectric layer 158 on all of the horizontal surfaces.

The implantation via plasma has the advantage of allowing an implantation continuously in a volume extending from the surface of the implanted layer. Furthermore, using a plasma allows for an implantation at shallower depths than the minimum depths that can be obtained with implanters. As such, an implantation via plasma makes it possible to implant effectively and relatively homogeneously or at the least continuously thin thicknesses which can then be removed via selective etching. This continuity of implantation from the implanted face makes it possible to improve the homogeneity of the modification according to the depth, which leads to a constant etching speed over time of the implanted layer. Moreover, the increase in the selectivity conferred by the implantation with respect to the other layers is effective right from the start of the etching of the implanted layer. The implanting by plasma as such allows for a substantially improved control in the etching precision.

The plasma implantation typically makes it possible to implant then to remove thicknesses extending from the surface of the implanted layer and over a depth ranging from 0 nm to 100 nm. Conventional implanters allow for an implantation in a volume between 30 nm and several hundred nanometers. On the other hand, conventional implanters do not make it possible to implant the species between the surface of the layer to be implanted and a depth of 30 nm. In the framework of the development of this invention, it was noted that the implanters therefore do not make it possible to obtain an etching speed that is sufficiently constant of the modified layer and this from the surface of the latter, as such leading to lesser etching precision compared to what the invention allows.

The use of a plasma to modify the layer to be removed is therefore particularly advantageous in the framework of the invention which aims to remove a thin thickness of a dielectric layer 152, typically between 1 and 10 nm and more generally between 1 and 30 nm.

The step of modification carried out using a plasma modifies the dielectric layer 152 continuously from the surface of the dielectric layer 152 and over a thickness between 1 nm and 30 nm and more preferably between 1 nm and 10 nm.

According to a particularly advantageous embodiment, the modification 430 by implantation of the dielectric layer 152 and the removal 440 of the modified dielectric layer 158 are carried out in the same piece of equipment: the modification in a plasma reactor and the removal in a chemical reactor with gaseous HF. The modification of the dielectric layer 152 to be removed carried out by an implantation by plasma as such makes it possible to carry out the modification of the dielectric layer 152 and the dry etching in the same chamber of the modified dielectric layer 158 which is very advantageous in terms of simplification, time and cost of the method.

Particularly advantageously, the modification of the dielectric layer 152 by implantation of light ions, ions with a hydrogen (H) base, makes it possible to substantially improve the selectivity of this modified dielectric layer 158 with respect to the layer 146 as a semiconductor material, typically silicon. This implantation also makes the thickness of the modified dielectric layer 158 etched faster than that of the unmodified dielectric layer 152.

Preferably, the modification of the dielectric layer 158 retains a thickness of unmodified dielectric 152 on the flanks of the gate. This thickness is retained, at least partially, during the selective etching. It then defines gate spacers.

Preferably, the implantation parameters, in particular the energy of implantation of the light ions coming from the first component and of the implanted dose, are provided in such a way that the modified dielectric layer 158 can be selectively etched with respect to the material of the layer 146 made of a semiconductor material and with respect to the unmodified dielectric layer 152.

Preferably, a single step of modification is carried out in such a way as to modify the dielectric layer 152 over its entire thickness over all of the surfaces parallel to the plane of a substrate whereon the gate rests and to not modify the dielectric layer 152 in all of its thickness over the surfaces parallel to the favored direction of implantation.

Advantageously, the implantation is carried out in such a way as to modify the entire thickness of the dielectric layer 152 outside of the dielectric layer 152 arranged on the flanks of the gate. As such, the removal 440 (advantageously comprising a dry etching 441 and removal of residue 442 on the surface) removes all of the modified dielectric layer 158 except for a portion at least of the unmodified dielectric layer 152 located on the flanks of the gate.

Advantageously, the implantation modifies the dielectric layer 152 from its surface and up to a depth that corresponds to a portion at least of its thickness. Preferably, the implantation modifies the dielectric layer 152 uninterruptedly from the surface.

According to a particular embodiment, the method comprises a single step of modification 430 carried out in such a way as to modify the dielectric layer 152 in all of its thickness over all of the surfaces parallel to the plane of a substrate whereon the gate rests and to not modify the dielectric layer 152 in all of its thickness over the surfaces perpendicular to this plane. These surfaces perpendicular to this plane, i.e. perpendicular to the layer 146 made of a semiconductor material forming a conduction channel or to the solid substrate are typically parallel to the flanks of the gate of the transistor. As such, following this step of modification 430, a removal 440 (advantageously comprising a dry etching 441 and a removal of residue 442 on the surface) selective of the modified dielectric layer 158 makes it possible to remove the dielectric layer over all of the surfaces except those parallel to the flanks of the gate.

According to another embodiment, the method comprises several sequences with each one comprising a step of modification 430 and a step of removing 440. During the course of at least one of the steps of modification 430, only a portion of the thickness of the dielectric layer 152 is modified. Advantageously, the sequences are repeated until the disappearance of the dielectric layer 152 over all of the surfaces parallel to the plane of a substrate whereon the gate rests. Only the faces parallel to the flanks of the gate retain a thickness of dielectric, with this thickness not having been the object of modification via implantation.

According to an advantageous embodiment, the dielectric layer 152 is arranged directly in contact with the layer 146 made of a semiconductor material. More preferably the dielectric layer 152 is arranged directly in contact with the gate which is more preferably formed in a semiconductor material.

Advantageously, the implantation in particular its energy, the concentration and the nature of the light ions, the dose used and the duration of the implantation method, are provided in such a way that the modified dielectric layer 158 can be selectively etched with regards to the rest of the dielectric layer, i.e. to the unmodified dielectric layer 152.

Figure 2C:
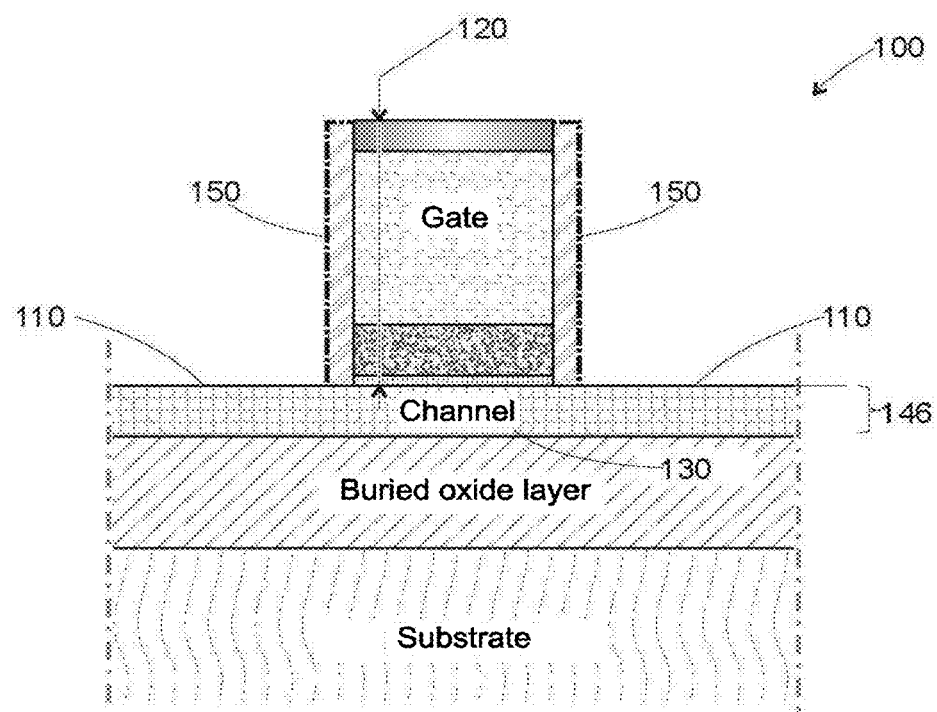

FIG. 2c shows the final result of the following step after having proceeded with the etching, i.e. with the removal 440 of the modified dielectric layer 158 and possibly repeated, on the one hand, the modification operation described in the preceding figure, and on the other hand, the removing operation of the modified dielectric layer 158.

According to an embodiment, prior to the removal of the modified dielectric layer, a (pre-)annealing 443 is carried out at atmospheric pressure or in a vacuum, at a temperature more preferably greater than 100° C. in order to eliminate all of the humidity on the surface of the wafer. The waiting time between the pre-annealing 443 and the dry etching 441 with a gaseous hydrofluoric acid (HF) base must be maintained at a minimum. Preferably, the pre-annealing 443 and the dry etching 441 with a hydrofluoric acid HF base must be carried out in the same tool.

The method according to this invention comprises a removal of the modified dielectric layer 158 consisting, as already mentioned, in having recourse to, a sequence of steps. A first step comprising a dry etching 441 carried out by putting into presence of a gaseous mixture comprising at least one first component with a hydrofluoric acid (HF) base and a second step comprising a removal of non-volatile residue 442 present on the surface of the wafer (and in particular on the surface of the modified dielectric layer 158).

The dry etching 441 is more preferably carried out in an etching tool able to inject both the gaseous hydrofluoric acid (generated either by evaporation using a liquid source, or using a bottle under pressure) and the inert gas (for example nitrogen (N2) or argon (Ar)) in order to control the concentration of hydrofluoric acid in the chamber of the reactor and consequently the rate of etching. The flow rates for each flow of gas must be preferentially controlled independently. The tool can be used to etch a single wafer as well as a lot of wafers. The etching tool can advantageously operate at an ambient pressure and temperature and/or at low pressure and/or at high temperature.

The putting into presence is carried out more preferably in a simple chemical reactor: a hermetic enclosure wherein the reagents are introduced and which operates either at ambient temperature and atmospheric pressure, or at a temperature higher than the ambient temperature and at a pressure less than atmospheric pressure. The putting into presence is advantageously not carried out in a plasma reactor, which would not have any advantage with respect to a simple chemical reactor. The gaseous HF is available in a bottle and can therefore be injected directly into the reactor after expansion of the pressure at which the reactor operates. The gaseous HF can also be generated by evaporation of liquid HF and driving by a flow of nitrogen to the reactor. The gaseous HF, regardless of the method used hereinabove, is mixed with a flow of nitrogen in order to control the HF concentration in the reactor. This mixture between gaseous HF and pure N2 is carried out either in-situ in the reactor, or upstream of the reactor in a mixing chamber.

The dry etching 441 advantageously makes it possible to remove a thickness of the modified dielectric layer 158 between 1 nanometer and a few tens of nanometers. Preferentially, the gaseous mixture used during the dry etching comprises a second component. The second component is more preferably an inert gas, for example chosen from nitrogen or argon. The use of an inert gas makes it possible to prevent any other parasitic chemical reaction that could damage the etching selectivities with the other materials (unmodified SiN, SiO2, semiconductor). Advantageously, the second component makes it possible to control the concentration of HF. The second component, more preferably an inert gas, allows for the dilution at the desired concentration of the HF. In the case of use of pure HF, the selectivity with silicon oxide would be lost.

The parameters of the dry etching 441, and in particular the gas ratio between the first component and the second component, are provided in such a way that the modified dielectric layer 158 can be selectively etched with respect to the layer 146 made of a semiconductor material and with respect to the unmodified dielectric layer 152.

Preferably, the gas ratio between the first component and the second component is between 1:25 and 1:1. The first component is advantageously with a hydrofluoric acid base and the second component is advantageously with an inert gas base. Preferably, the inert gas (i.e. the second component) is chosen from argon (Ar) and nitrogen (N2). The content in inert gas is configured in such a way as to adjust the ratio and, consequently, the rate of etching. Advantageously, nitrogen is preferred to argon for a less expensive method of carrying out. The dry etching is more preferably carried out under a temperature between 15° C. and 80° C., a pressure between 40 Torr and 760 Torr, during a duration ranging from a few seconds to a few minutes (according to the thickness of the modified dielectric layer 158 to be removed).

The dry etching transforms into non-volatile residue or solid salts the modified dielectric layer 158. Advantageously, the gaseous HF is available in a bottle and can therefore be injected directly into the reactor after expansion of the pressure at which the reactor operates. The gaseous HF can also be generated by evaporation of liquid HF and driving by a flow of nitrogen to the reactor. The gaseous HF, regardless of the method used hereinabove, is mixed with a flow of pure nitrogen in order to control the HF concentration in the reactor. This mixture between gaseous HF and pure N2 is carried out either in-situ in the reactor, or upstream of the reactor in a mixing chamber.

Advantageously, a removal 442 of non-volatile residue is carried out in order to remove any non-volatile residue present on the surface of the wafer and formed during the dry etching. Advantageously, the dissolution of the non-volatile residue in the form of solid salts only forms on the volume of the material of the modified dielectric layer 158. Advantageously, the removal 442 of non-volatile residue is carried out after the dry etching 441 is such a way as to remove, par sublimation, the residue formed during the dry etching 441 with a gaseous hydrofluoric acid base. In this embodiment, the removing of non-volatile residue can, according to an alternative, comprise a thermal annealing carried out under a low pressure between $10.10^{-3}$ Torr and 2 Torr. According to a non-limiting example of the invention, the annealing is carried out in an environment comprising nitrogen and hydrogen (4%), at a temperature of 200° C., under a pressure of 1.5 Torr, of which the flow rate is 2000 sccm, during a duration of 180 seconds. Particularly advantageously, at the end of this step of removing 442 non-volatile residue, the residue is volatilized, leaving a surface free of all residue.

According to an alternative, the removing 442 of non-volatile residue can comprise a wet clean with a deionized water base. To do this, according to a non-limiting embodiment, the wafer is immersed in a bath comprising deionized water, for a period of about 10 minutes, with a re-circulation of the flow. According to another embodiment, the surface of the wafer or of the lot of wafers is "sprayed" using a spray comprising a solution of deionized water. Particularly advantageously, at the end of this step of removing non-volatile residue, the residue is solubilized, leaving a surface free from all residue.

The stopping of the etching is done on the unmodified dielectric layer 152 or on the monocrystalline silicon of the layer 146 or on the hard mask 124 at the top of the gates. Note here, in reference to the problem described in FIG. 1b, that there is no consumption of silicon due to the use of hydrofluoric acid. Moreover, an optimization of the step of modification 430 by implantation of light species described hereinabove only results in a modification of the dielectric layer 152 and the etching operation that follows therefore does not affect the underlying silicon. As such, as shown, there is very advantageously no consumption in the S/D zones 110 of the silicon layer 146.

At the end of these operations there remains of the initial dielectric layer 152 only vertical patterns, primarily on the flanks of the stack of layers that form the gate 120. They constitute the spacers 150 of the transistor gate.

Figure 2D:
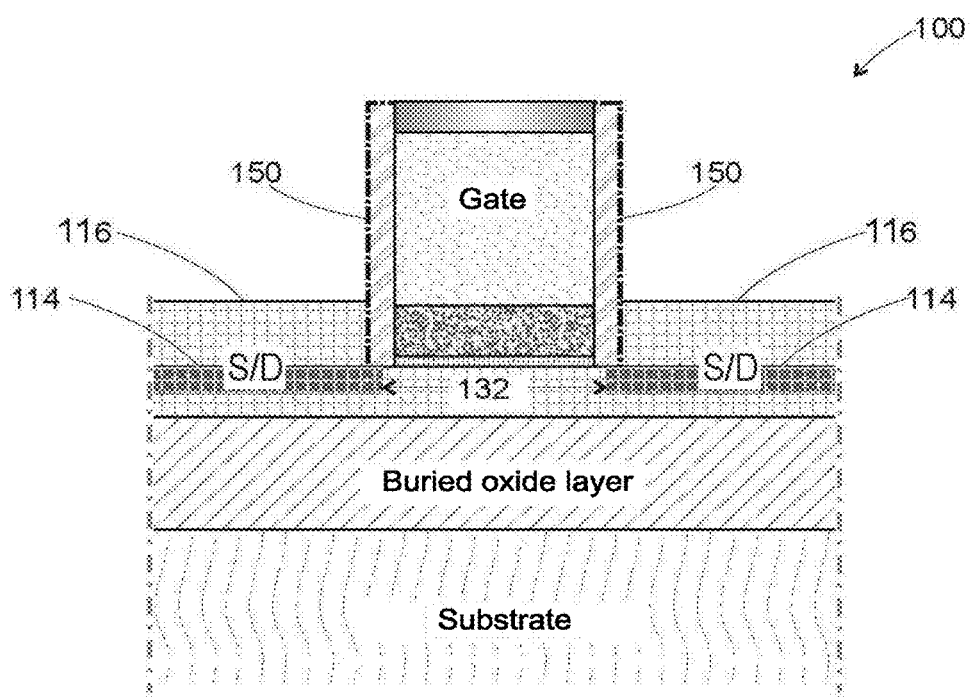

FIG. 2d shows the formation of the drain and source zones of a transistor of the FDSOI type.

At the end of the last or only step of removing the modified dielectric layer 158, i.e. when it has been removed on all of the horizontal surfaces, a cleaning operation is carried out referred to as "wet clean". As has been already noted hereinabove, wet etching and wet clean are similar operations that can advantageously be combined into a single operation.

The source and drain electrodes 110 can then be formed. As already mentioned, the doping which will delimit source and drain and therefore the length of the channel 132 can be carried out via ionic implantation before proceeding with an epitaxial growth on these zones in order to increase their section and decrease their resistance. If the doping is carried out before epitaxial growth, as shown in FIG. 2d, the method is said to be "extension first", used to indicate that the extensions (of the source and of the drain under the spacers) are carried out first, i.e. before epitaxial growth. In the opposite case it is said to be "extension last", we proceed directly to the step of epitaxial growth without prior doping. The doping of the source/drain zones is carried out only after epitaxial growth of these zones. In the case of transistors with an n-type channel (nMOS), the dopants implanted are typically arsenic (As) or phosphorous (P). For transistors with a p-type channel (pMOS) the dopants are boron (B) or boron difluoride (BF2).

The result is shown in FIG. 2d which shows the doped source/drain zones 114 before epitaxial growth of the raised source/drain zone 116.

Advantageously, the gate of the transistor is located on a stack of layers forming an elaborated substrate of the silicon on insulator (SOI) type. Preferably, it is arranged directly in contact with the layer forming the conduction channel. Advantageously, using the invention with such a SOI substrate makes it possible to preserve the integrity of the surface layer of very low thickness that forms the conduction channel of a transistor formed using an SOI substrate.

Advantageously, the semiconductor material is silicon. Advantageously, the etching is selective with silicon oxide (SiO2). The semiconductor material can also be germanium (Ge) or silicon-germanium SiGe. The step of removing the modified dielectric layer is carried out by etching, preferably using gaseous HF; which particularly advantageously allows for a selective etching with Ge or SiGe and/or SiGe oxide or Ge oxide.

According to an embodiment, the transistor is a transistor of the FDSOI type. Preferably, the method comprises a step for the full removal of the dielectric layer other than the flanks and on either side of the gate in order to expose the layer made of a semiconductor material and a step of forming source drain zones using the layer made from a semiconductor material, for example by epitaxy.

Figure 3:
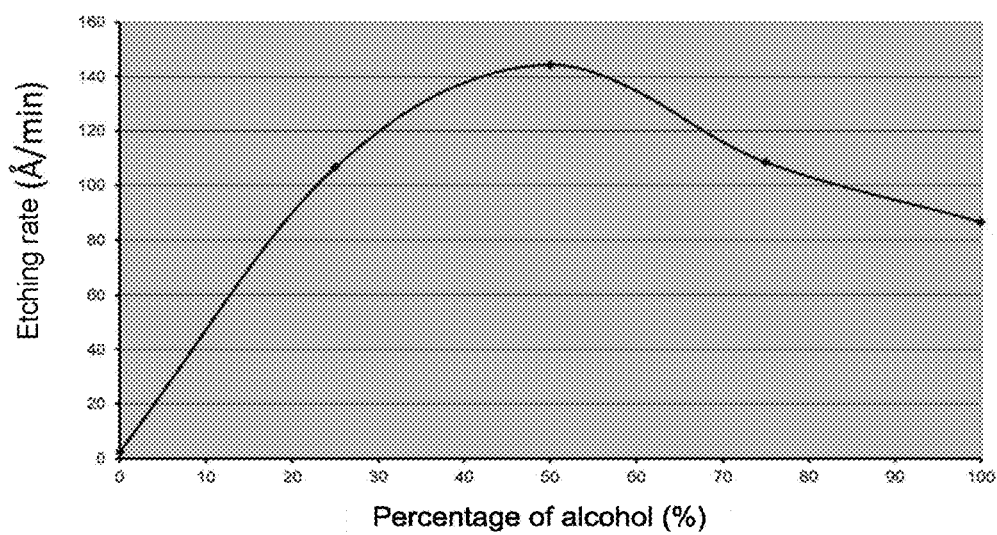
FIG. 3 shows a graph representing the etching rate of a layer of silicon oxide according to the percentage of alcohol present.

FIG. 3 shows a graph representing the rate of etching of a silicon oxide layer according to the percentage of alcohol present in the gaseous flow introduced into the etching reactor. The methods for etching with a gaseous mixture base using hydrofluoric acid were developed primarily for performing etchings of devices of the MEMS type (Micro-Electro-Mechanical Systems), wherein a sacrificial silicon oxide layer has to be removed by means of an isotropic method. The method, with a hydrofluoric acid (HF) base in gaseous phase, has substantial advantages compared to a method with a hydrofluoric acid (HF) base in liquid phase. In particular, using a method in gaseous phase makes it possible to remove the forces of capillarity that are established between a solid surface and a liquid phase. In particular in the case of MEMS the forces of capillarity can generate a coming together of the surfaces of the fixed and mobile portions of the device, such that the permanent forces are then established (Van Der Waals force for example) immobilizing the mobile portion and making the device non-operational. This is then referred to as the stiction phenomenon, that the gaseous HF method makes it possible to avoid for a large part.

The etching methods with a gaseous mixture base using hydrofluoric acid were also evaluated in order to carry out cleanings prior to a step of epitaxy for devices of the FEOL type. However, these so-called "dry" cleanings (for example, with a gaseous hydrofluoric acid base) did not demonstrate performance superior to the conventional so-called "wet" cleans (for example, with a liquid hydrofluoric acid base) and were therefore not widely adopted.

In order to proceed with etching a silicon oxide (SiO2) layer by molecules of hydrofluoric acid HF, proton acceptor groups are required. In the case of hydrofluoric acid in liquid phase, water (H2O) fulfils this role naturally. In the case of hydrofluoric acid in gaseous phase, hydroxyl groups are added to the flow of gas entering via co-injection of alcohol vapors (methanol, ethanol or isopropanol are the most commonly used) in the chamber of the etcher with the gaseous hydrofluoric acid. The methods used for the etchings of MEMS devices operate in this way. Without co-injection of alcohol, the etching speed of the silicon oxide is extremely low as shown in FIG. 3. The axis of the abscissa shows the alcohol co-injected, for example of IPA (Isopropyl alcohol) with gaseous hydrofluoric acid and the axis of the ordinates shows the etching rate (in Angstroms/minute).

It is observed that the higher the percentage of alcohol is and therefore the proton acceptor groups on the surface is low, the lower the rate of etching of the silicon oxide layer is (in other words the less the SiOx layer is etched). On the contrary, the more the percentage of alcohol increases, the more the rate of etching increases, favoring the etching of the silicon oxide layer.

As such, in order to limit the etching of a silicon oxide layer, it must be avoided to simultaneously put the hydrofluoric acid and the alcohol into presence (i.e. the proton acceptor groups).

Advantageously, the method according to this invention, by proposing a sequence of successive steps (on the one hand, a removal 442 of non-volatile residue on the surface and, on the other hand, a dry etching 441 with a hydrofluoric acid base) makes it possible to avoid the simultaneous putting into presence of hydrofluoric acid and proton acceptor groups (such as alcohol, water), and therefore authorizes a selective etching of the modified dielectric layer 158 with respect to a silicon oxide layer (of which the etching will be limited).

Figure 1A:
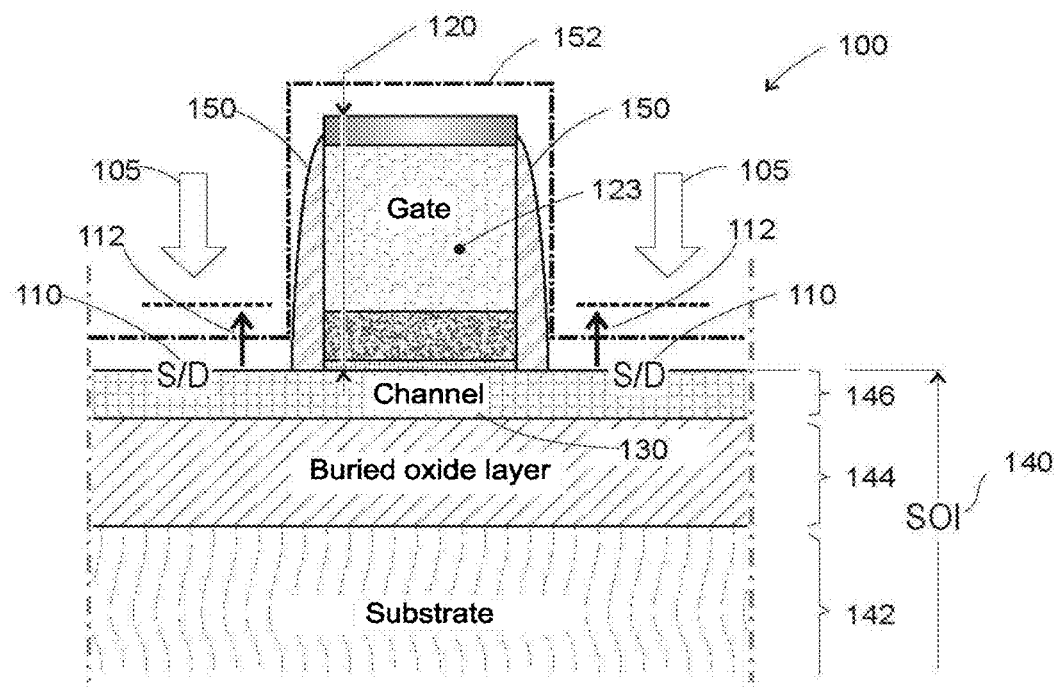
FIG. 1a to 1d show, on the one hand, a cross-section view of an example of a MOSFET transistor of the FDSOI type in the process of production and, on the other hand, shows various defects that can be observed on structures of FDSOI transistors during the etching of the spacers by using one or the other of the standard methods of anisotropic etching developed by the microelectronics industry.
Figure 1B:
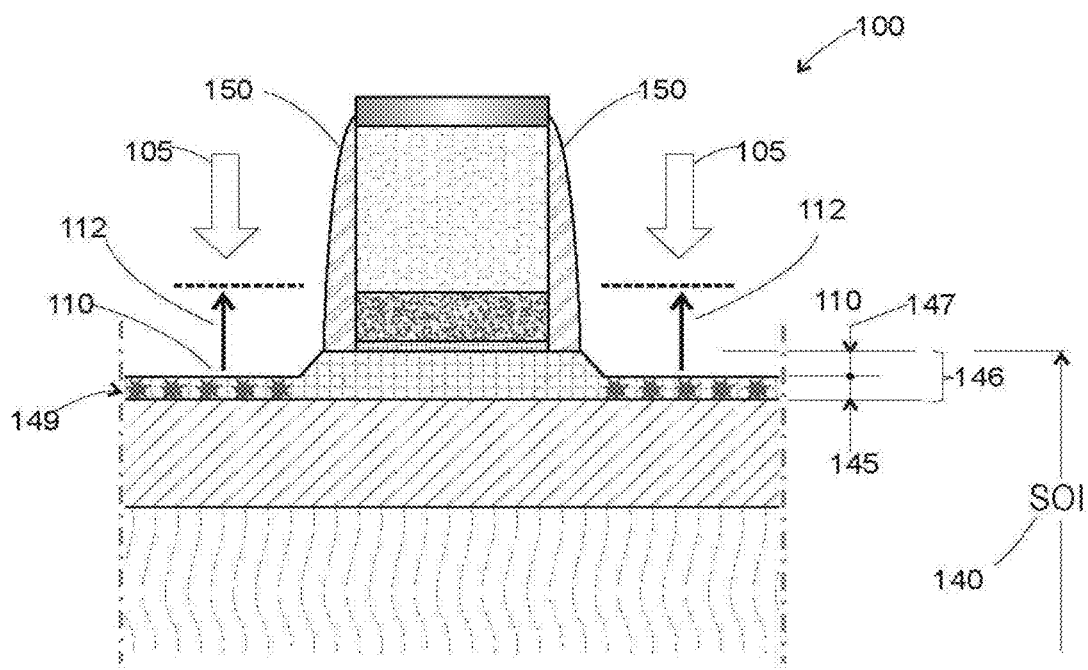
Figure 1C:
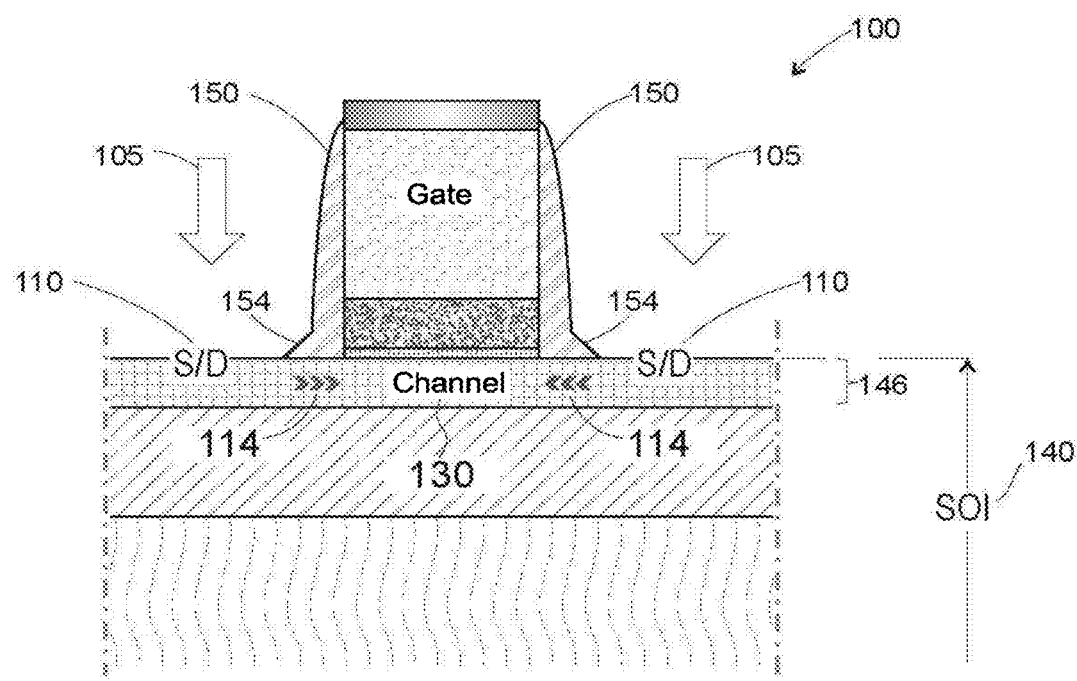
Figure 1D:
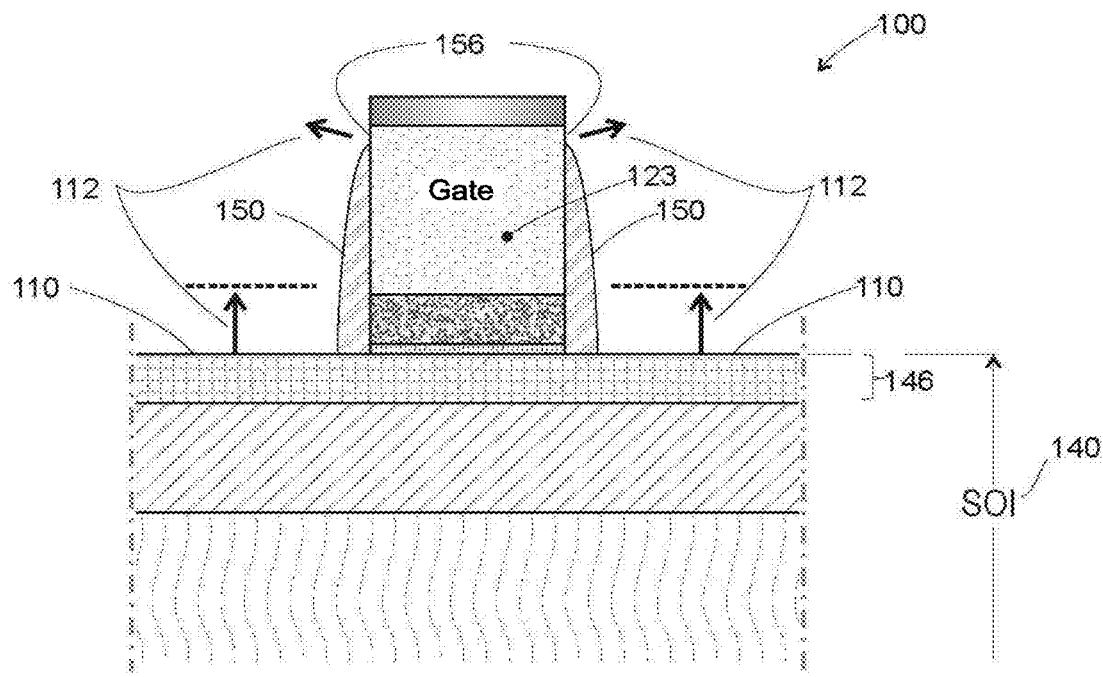
Figure 4:
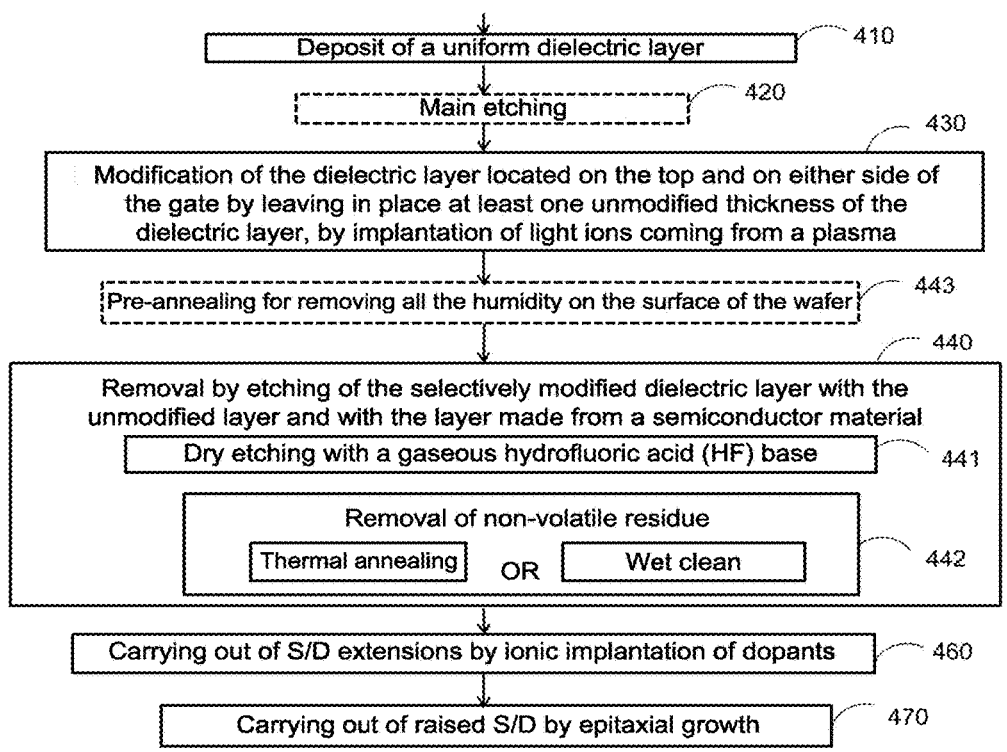
FIG. 4 summarizes the steps of an example of a method of the invention intended to form spacers and which does not introduce or which at least limits the defects described in FIGS. 1b to 1d.

FIG. 4 summarizes the steps of the method of the invention intended to form spacers and which do not introduce any of the defects described in particular in FIGS. 1b, 1c and 1d for the carrying out of transistors, for example FDSOI.

After depositing 410 via LPCVD of a uniform dielectric layer 152 on all of the surfaces of the devices in the process of manufacture, said modified dielectric layer 158 is removed on all of the surfaces that are not intended to form the spacers. This removal comprises several steps, of which the steps 430, 440 and optionally the prior step 420.

As such, optionally, we proceed with a "main" etching, more preferably a conventional an isotropic dry etching 420 of the modified dielectric layer 158. This is typically carried out in a plasma of the CH3F/O2/He type described hereinabove. In the framework of specific implementations of the invention, it can be decided to maintain or not the main step of etching 420, with the following steps then applying either on the dielectric layer 152 such as deposited or on the layer remaining after a main etching was carried out beforehand as in the standard method of etching spacers.

As shown in FIG. 2b, the following step 430 consists in anisotropically modifying all or a portion 154 of the dielectric layer remaining 152 by implantation of light ions. Advantageously, the second component interacts on the first component so as to dissociate the first component and favor the creation of light ions, increasing as such the concentration in H ions and the dose.

According to the applications of the method of the invention it may be preferred to use a plasma etcher for the plasma implantation in particular for the following reasons: the cost of the equipment is lower, the manufacturing cycle times can be shorter since the main step of etching 420 and that of modification 430 of the dielectric layer 152 can then be carried out in the same equipment without exposing to air the devices in the process of manufacture. Note in particular that the step of modification 430 can be carried out in many different ways by adapting all sorts of means commonly used by the microelectronics industry, such as using any type of etcher, for example in an ICP (Inductively Coupled Plasma) reactor, or in a reactor of the CCP (Capacitively Coupled Plasma) type that makes it possible to control the energy of the ions. A type of plasma referred to as by immersion commonly used for carrying out an implantation of species on the surface of a device in the process of manufacture can also be used.

In order to choose the implantation parameters those skilled in the art, in order to determine the behavior of the material to be etched in the type of plasma etcher chosen, will proceed beforehand more preferably with "solid wafer" tests in order to establish behavior curves. Those skilled in the art will then deduce from them the implantation parameters, in particular the energy and the dose of ions, i.e. the exposure time, to be used to reach the desired thickness of the material to be modified.

The following step 440 is that wherein the removal is carried out by etching of the modified layer or at the least of the modified thickness of the modified dielectric layer 158. In order to prevent the problems of conventional methods of etching of spacers described in FIGS. 1b to 1d, it is necessary that the etching of the modified dielectric layer 158 be as selective as possible with respect to the silicon in particular in order to not attack the monocrystalline silicon of the source/drain zones with the disadvantages and consequences described hereinabove.

According to an embodiment, prior to the removal of the modified dielectric layer, a vacuum (pre-)annealing 443 is carried out, at a temperature more preferably greater than 100° C. in order to remove all of the humidity from the surface of the wafer. The waiting time between the pre-annealing 443 and the dry etching 441 with a gaseous hydrofluoric acid (HF) base must be maintained at a minimum. Preferably, the pre-annealing 443 and the dry etching 441 with a hydrofluoric acid HF base must be carried out in the same tool.

The removal 440 of the modified dielectric layer 158 advantageously comprises a dry etching 441, more preferably, with e hydrofluoric acid (HF) base for a dielectric layer 152, for example with a silicon nitride base, combined with a removal 442 of non-volatile residue present on the wafer containing the devices in the process of manufacture. This simplifies the method and saves time.

The thickness of the modified dielectric layer 158 is typically comprised in a range of values ranging from 1 nanometer to a few tens of nanometers. The etching time can range from a few seconds to a few minutes. They obviously directly depend on the thickness of the dielectric layer that was modified 158.

By way of example, in order to remove a thickness of 10 nm of the modified dielectric layer 158, a gaseous mixture must be formed of which the ratio of the first and second components is comprised as such: 31% gaseous hydrofluoric acid (HF) for 69% dry nitrogen (N2). An etching time of about 2 minutes is required at ambient temperature and at ambient pressure.

The dry etching 441 of the modified dielectric layer 158 will also be selective with respect to the silicon oxide. This is in particular the case in order to be able to carry out three-dimensional transistors of the FinFET type. A selective dry etching 441 with silicon and with its oxide (Si/SiO2), along with a removal 442 of the surface residue can then also be practiced for this step of removing the modified dielectric layer 158.

This embodiment makes it possible to obtain, for example, a very good selectivity of the modified nitride with respect to the unmodified nitride and the material of the layer 146 in an unmodified semiconductor material. Advantageously, the selectivities are improved thanks to the gaseous HF, with respect to liquid HF. In particular, the selectivity is multiplied by 3 on unmodified nitride, by 14 on silicon oxide. On a semiconductor material (for example, Si, SiGe or Ge), the selectivity is infinite.

Note here that there are etching reactors that make it possible to carry out an implantation, for example of hydrogen, using a plasma that can be followed, in the same system, with the removal of the modified dielectric layer 158 using dry etching as described hereinabove. As such, it is possible in this case to chain the cycles of modification 430 and of removal 440 of the dielectric layer 152 selectively with Si or SiO2, without exposing the wafer to air. This is an additional incitation to the use of an etching reactor in order to implement the invention rather than using a standard implanter each time that this is possible.

As already mentioned the operations of modification 430 of the dielectric layer 152 and of removal 440 of the modified dielectric layer 158 can optionally be repeated 450 until the disappearance of the dielectric material of the modified dielectric layer 158 on all of the horizontal surfaces.

The following steps of the method are not different from those corresponding from the standard methods wherein the extensions of the source/drain zones 460 are possibly carried out by ionic implantation of dopants before epitaxial growth of the raised source/drain 470 of FDSOI transistors.

The table hereinafter provides the typical conditions for implementing the step 430 of modification of the dielectric layer 152 in the case of use of a standard plasma etching reactor. These conditions largely depend on the thickness to be modified in the dielectric layer 152. This is only a particular example of implementation of the step 430 of modification of the layer to be etched. As already mentioned hereinabove, other means can be used for the implantation of the light species used to modify the layer to be etched. In particular, plasmas with low or high density or plasmas via immersion can be used. Advantageously, any type of dry etching device can potentially be used and in particular those referred to as ICP (inductively coupled plasma) or CCP (capacitively coupled plasma). The possibility to pulse the source and/or the bias also makes it possible to have a better control on the depth of implantation for low thicknesses.

| | |
|---|---|
| Etching reactor: | The values hereinbelow apply more particularly to the ICP type etcher although any type of dry etching device can potentially be used. |
| Modified thickness: | from 1 nanometer to a few tens of nanometers, typically 15 nanometers. |
| Chemistry | based on chemistry with a hydrogen base and/or with a helium base such as H2, NH3 or a combination of helium and hydrogen, or helium and NH3. |
| Component flow rate: | |
| H2 | 10 sccm-500 sccm (standard cubic centimeters per minute) |
| He | 50 sccm-500 sccm |
| NH3 | 10 sccm-500 sccm |
| Power of the source: | 0-2000 W |
| Polarization voltage: | 20 V-500 V |
| Frequency | 100 Hz-500 kHz (for the pulsed mode) |
| Operating cycle | 10%-90% (for the pulsed mode) |
| Pressure: | 5 milli-100 milli Torr |
| Temperature: | 10° C.-100° C. |
| Time: | a few seconds to a few hundred seconds |

By way of a non-limiting example of the invention, in order to modify a thickness of 15 nm of silicon nitride in an etcher of the ICP type (TCP RF), continuously, the ionic energy (or polarization voltage) required for a plasma formed from a component with a hydrogen (H) base, of which the flow rate is 50 sccm, for a voltage of 250V for a duration of 60 seconds. In this case, the pressure used is 10 mTorr and the power of the source 500 W.

The invention is not limited to only the embodiments described hereinabove, but extends to all of the embodiments that fall within the scope of the claims.

The method according to this invention with a gaseous hydrofluoric acid base is carried out at ambient temperature (i.e. between 20° C. and 30° C.) and at atmospheric pressure 760 Torr. However, controlling the temperature of the gas with a HF base in such a way that it is preferentially of a value greater than that of ambient temperature or/and controlling the pressure in such a way as to preferentially be lower than that of the ambient pressure would lead to obtaining an even higher selectivity between a silicon nitride layer (SiN) and a silicon oxide layer (SiO2) or an unmodified silicon nitride layer SiN, by reducing the quantity of humidity on the surface of the wafer.

The invention claimed is:

1. A method for forming spacers of a gate of a field effect transistor, with the gate comprising flanks and a top and being located above a layer made of a semiconductor material, the method comprising:
   forming a dielectric layer covering the gate;
   modifying the dielectric layer, after the forming, by putting the dielectric layer into a presence of a plasma comprising ions with a hydrogen base and/or ions with a helium base, and choosing conditions of the plasma, including an energy of the ions and an ion implantation dose, such that the modifying comprises implanting the ions by bombarding the dielectric layer with the ions in the plasma, the bombarding being anisotropic in a direction parallel to the flanks of the gate, which modifies at least portions of the dielectric layer that are located on the top of the gate and on sides of the gate and that are perpendicular to the flanks of the gate, and which retains unmodified portions of the dielectric layer covering the flanks of the gate or portions unmodified over an entire thickness thereof;
   removing humidity from the modified dielectric layer at a temperature greater than an ambient temperature; and
   removing the modified dielectric layer, after the step of removing the humidity, comprising:
      selective etching of the modified dielectric layer relative to the layer made of the semiconductor material and relative to the unmodified portions of the dielectric layer, the selective etching comprising a dry etching at the ambient temperature when at atmospheric pressure, performed by putting the modified dielectric layer into a presence of a gaseous mixture comprising at least one first component having a hydrofluoric acid base, with the at least one first component transforming the modified dielectric layer into non-volatile residue, and
      only after the dry etching, wet cleaning the non-volatile residue at the ambient temperature when at the atmospheric pressure, or, only after the dry etching, thermal annealing to sublimate the non-volatile residue.

2. The method according to claim 1,
   wherein the gaseous mixture further comprises a second component, and
   wherein parameters of the dry etching, including a gas ratio between the at least one first component and the second component, are provided such that the modified dielectric layer is selectively etched relative to the layer made of the semiconductor material and relative to the unmodified portions of the dielectric layer.

3. The method according to claim 2, wherein the at least one first component is generated by evaporation using a liquid source or using a pressurized bottle.

4. The method according to claim 1, wherein said modifying and said removing are carried out in a chemical reactor.

5. The method according to claim 4,
   wherein the chemical reactor comprises an enclosure, and
   wherein the modifying and the removing are carried out at the ambient temperature when at the atmospheric pressure, or are carried out at a temperature greater than the ambient temperature when at a pressure less than the atmospheric pressure.

6. The method according to claim 1, wherein the gaseous mixture comprises hydrofluoric acid (HF).

7. The method according to claim 1, wherein the gaseous mixture is free from proton acceptor groups.

8. The method according to claim 1, wherein the gaseous mixture comprises a second component having an inert gas base, chosen from nitrogen and/or argon.

9. The method according to claim 8, wherein a gas ratio between the at least one first component and the second component is between 1:25 and 1:1.

10. The method according to claim 1, wherein the dry etching is carried out under a temperature between 15° C. and 80° C., at a pressure between 40 Torr and 760 Torr, and for a duration of up to about two minutes.

11. The method according to claim 1, wherein the thermal annealing is carried out at a temperature between 200° C. and 400° C.

12. The method according to claim 11, wherein the thermal annealing is carried out at a low pressure between $10.10^{-3}$ Torr and 2 Torr.

13. The method according to claim 11, wherein the thermal annealing is carried out for a time between 60 seconds and 600 seconds.

14. The method according to claim 1, wherein the wet clean is carried out with a deionized water base.

15. The method according to claim 1, further comprising, prior to the removing, vacuum thermal annealing at a temperature greater than 100° C.

16. The method according to claim 1, wherein the dielectric layer is formed from at least one dielectric material of which a dielectric constant k is less than or equal to 7.

17. The method according to claim 1, wherein the dielectric layer is a layer of nitride.

18. The method according to claim 1, wherein the dielectric layer is a layer with a silicon (Si) base.

19. The method according to claim 1, wherein a material of the dielectric layer is taken from: SiCO, SiC, SiCN, SiON, SiOCN, SiCBN, SiOCH, and $SiO_x$, where x is a positive integer.

20. The method according to claim 1,
   wherein the semiconductor material is silicon, and
   wherein the selective etching is carried out with silicon and/or with a layer of silicon oxide.

21. The method according to claim 1, further comprising forming a hard mask of at least one silicon oxide layer located on the gate, or forming a shallow trench isolation.

22. The method according to claim 1, wherein said modifying comprises modifying all of a thickness of the dielectric layer over all of surfaces parallel to a plane of a substrate on which the gate is disposed, and not modifying all of the thickness over all of surfaces perpendicular to the plane.

23. The method according to claim 1,
   wherein the layer made of the semiconductor material is taken from silicon (Si), germanium (Ge), and silicon-germanium (SiGe), and
   wherein the ions are taken from helium and/or hydrogen and/or ammonia.

24. The method according to claim 1, wherein the ions are with the hydrogen base and a flow rate of the ions is between 10 sccm and 500 sccm.

25. The method according to claim 1, wherein the ions are with the helium base and a flow rate of the ions is between 50 sccm and 500 sccm.

26. The method according to claim 1, wherein the modifying is carried out with a polarization voltage ranging from 20V to 500V, at a pressure between 5 mTorr and 100 mTorr, and at a temperature between 10° C. and 100° C.

27. The method according to claim 1, wherein the modifying modifies the dielectric layer in a continuous manner from a surface of the dielectric layer and over a thickness between 1 nm and 30 nm.

28. The method according to claim 1, wherein the field effect transistor is of a FDSOI type or of a FinFET type.

29. A method for forming spacers of a gate of a field effect transistor, with the gate comprising flanks and a top and being located above a layer made of a semiconductor material, the method comprising:
    forming a dielectric layer covering the gate;
    modifying the dielectric layer, after the forming, by putting the dielectric layer into a presence of a plasma comprising ions with a hydrogen base and/or ions with a helium base, and choosing conditions of the plasma, including an energy of the ions and an ion implantation dose, such that the modifying comprises implanting the ions by bombarding the dielectric layer with the ions in the plasma, the bombarding being anisotropic in a direction parallel to the flanks of the gate, which modifies at least portions of the dielectric layer that are located on the top of the gate and on sides of the gate and that are perpendicular to the flanks of the gate, and which retains unmodified portions of the dielectric layer covering the flanks of the gate or portions unmodified over an entire thickness thereof;
    pre-annealing the modified dielectric layer at a temperature greater than an ambient temperature to remove humidity from the modified dielectric layer; and
    removing the modified dielectric layer, after the pre-annealing, comprising:
        selective etching of the modified dielectric layer relative to the layer made of the semiconductor material and relative to the unmodified portions of the dielectric layer, the selective etching comprising a dry etching at the ambient temperature when at atmospheric pressure, performed by putting the modified dielectric layer into a presence of a gaseous mixture comprising at least one first component having a hydrofluoric acid base, with the at least one first component transforming the modified dielectric layer into non-volatile residue, and
        only after the dry etching, wet cleaning the non-volatile residue at the ambient temperature when at the atmospheric pressure, or, only after the dry etching, thermal annealing to sublimate the non-volatile residue.

\* \* \* \* \*